United States Patent
Woo et al.

(10) Patent No.: US 9,575,405 B2
(45) Date of Patent: Feb. 21, 2017

(54) PHOTO MASK AND METHOD OF MANUFACTURING THE SAME

(71) Applicant: SAMSUNG DISPLAY CO., LTD., Yongin, Gyeonggi-Do (KR)

(72) Inventors: Jun-Hyuk Woo, Seongnam-si (KR); Jeong-Won Kim, Seoul (KR); Kwang-Woo Park, Hwaseong-si (KR); Dong-Eon Lee, Seoul (KR); Seung-Bo Shim, Asan-si (KR); Jin-Ho Ju, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 126 days.

(21) Appl. No.: 14/678,743

(22) Filed: Apr. 3, 2015

(65) Prior Publication Data

US 2016/0139504 A1    May 19, 2016

(30) Foreign Application Priority Data

Nov. 18, 2014  (KR) .................... 10-2014-0160714

(51) Int. Cl.
*G03F 1/38* (2012.01)
*G03F 1/58* (2012.01)
(Continued)

(52) U.S. Cl.
CPC . *G03F 1/38* (2013.01); *G03F 1/54* (2013.01); *G03F 1/58* (2013.01); *G03F 1/80* (2013.01); *G03F 7/0007* (2013.01)

(58) Field of Classification Search
CPC ............... G03F 1/38; G03F 1/52; G03F 1/54; G03F 1/58; G03F 1/76; G03F 1/80
(Continued)

(56) References Cited

U.S. PATENT DOCUMENTS 5,449,578 A * 9/1995 Man .................... G03F 1/14
428/432
2009/0220867 A1 * 9/2009 Fujikawa ............. G03F 1/14
430/5

(Continued)

FOREIGN PATENT DOCUMENTS

KR      2000-0001790 A     1/2000
KR      10-2004-0043450 A  5/2004
(Continued)

*Primary Examiner* — John A McPherson
(74) *Attorney, Agent, or Firm* — Lewis Roca Rothgerber Christie LLP

(57) ABSTRACT

A photo mask includes a transparent substrate and a mask pattern. The mask pattern is disposed on the transparent substrate. The mask pattern includes a blocking portion for blocking light and a transmitting portion for transmitting the light. The transmitting portion is adjacent to the blocking portion. The blocking portion includes a first blocking layer, a photo guide layer and a second blocking layer. The first blocking layer is disposed on the transparent substrate. The first blocking layer transmits a portion of the light. The first blocking layer includes a plurality of blocking patterns including a first blocking material. The photo guide layer is disposed on the first blocking layer. The photoguide layer guides the transmitted portion of the light to a side surface of the photoguide layer. The second blocking layer reflects the transmitted portion of the light.

20 Claims, 8 Drawing Sheets

(51) Int. Cl.
*G03F 1/80* (2012.01)
*G03F 1/54* (2012.01)
*G03F 7/00* (2006.01)

(58) Field of Classification Search
USPC .............................................................. 430/5
See application file for complete search history.

(56) References Cited

U.S. PATENT DOCUMENTS

2013/0316269 A1* 11/2013 Ye .............................. G03F 1/46
430/5
2014/0178804 A1* 6/2014 Lin ........................... G03F 1/58
430/5

FOREIGN PATENT DOCUMENTS

KR 10-2008-0110468 A 12/2008
KR 10-1391003 B1 5/2014

\* cited by examiner

PHOTO MASK AND METHOD OF MANUFACTURING THE SAME

CROSS-REFERENCE TO RELATED APPLICATION

This application claims priority to and the benefit of Korean Patent Application No. 10-2014-0160714, filed on Nov. 18, 2014 in the Korean Intellectual Property Office (KIPO), the content of which is herein incorporated by reference in its entirety.

BACKGROUND

1. Field

Example embodiments relate generally to photo masks, and more particularly to photo masks for manufacturing thin film transistor substrates and methods of manufacturing the photo masks.

2. Description of the Related Art

A liquid crystal display ("LCD") apparatus is an example of a flat panel display ("FPD"), which has recently been broadly used. Other examples of the FPD include, but are not limited to, a plasma display panel ("PDP") and an organic light emitting display ("OLED").

The LCD apparatus applies voltages to molecules of liquid crystal to adjust arrangements of the molecules thereby changing optical characteristics of a liquid crystal cell such as birefringence, optical activity, dichroism and light scattering to display an image.

The LCD apparatus includes a LCD panel displaying an image. In the LCD panel, a wire pattern is formed to include metal, and the wire pattern is formed by an exposure process and an etching process using a mask.

Recently, as a width of the wire pattern has reduced, a width of a photo pattern for forming the line pattern has also reduced. However, it is difficult to form the pattern below the resolution limit of a general exposure machine.

In order to reduce the width of the photo pattern, it can be considered to apply a high photosensitive photoresist and enhance the limit resolution of the exposure machine. However, a process cost may increase according to an excessive use of the exposure machine. Accordingly, in order to reduce the process cost, enhancement of exposure efficiency in an exposure process and a lifespan of the exposure machine are required.

SUMMARY

Accordingly, aspects of some example embodiments of the inventive concept are provided to substantially obviate one or more problems due to limitations and disadvantages of the related art.

Aspects of some example embodiments are directed toward a photo mask capable of enhancing exposure efficiency.

Aspects of some example embodiments are directed toward a method of manufacturing the photo mask.

According to example embodiments, a photo mask includes a transparent substrate and a mask pattern. The mask pattern is disposed on the transparent substrate. The mask pattern includes a blocking portion for blocking light and a transmitting portion for transmitting the light. The transmitting portion is adjacent to the blocking portion. The blocking portion includes a first blocking layer, a photo guide layer and a second blocking layer. The first blocking layer is disposed on the transparent substrate. The first blocking layer transmits a portion of the light. The first blocking layer includes a plurality of blocking patterns including a first blocking material. The photo guide layer is disposed on the first blocking layer. The photoguide layer guides the transmitted portion of the light to a side surface of the photoguide layer. The photoguide layer includes a photoguide material of which a refractive index is greater than a refractive index of the first blocking layer. The second blocking layer is disposed on the photoguide layer. The second blocking layer reflects the transmitted portion of the light. The second blocking layer includes a second blocking material of which a refractive index is less than the refractive index of the photoguide material.

In an example embodiment, the blocking patterns may have a slit pattern.

In an example embodiment, the blocking patterns may have a scattering pattern.

In an example embodiment, the refractive index of the photoguide layer may be greater than each of the refractive indexes of the first and second blocking layers by about 1%.

In an example embodiment, the refractive index of the photoguide layer may be in a range of about 1.1 to about 2.0. The refractive indexes of the first and second blocking layers may each be in a range of about 1.0 to about 1.4.

In an example embodiment, the first and second blocking materials may include at least one material selected from the group consisting of aluminum oxide (AlOx), barium fluoride (BaFx), gadolinium fluoride (GdF), hafnium fluoride (HfFx), hafnium oxide (HfOx), lanthanum fluoride (LaFx), lithium fluoride (LiF), magnesium fluoride (MgFx), magnesium oxide (MgO), silicon nitride (SiNx), silicon oxide (SiOx), strontium fluoride (SrFx), tantalum oxide (TaOx) and yttrium fluoride (YFx).

In an example embodiment, the photoguide material may include at least one material selected from the group consisting of aluminum oxide (AlOx), barium fluoride (BaFx), gadolinium fluoride (GdF), hafnium fluoride (HfFx), hafnium oxide (HfOx), lanthanum fluoride (LaFx), lithium fluoride (LiF), magnesium fluoride (MgFx), magnesium oxide (MgO), silicon nitride (SiNx), silicon oxide (SiOx), strontium fluoride (SrFx), tantalum oxide (TaOx) and yttrium fluoride (YFx).

In an example embodiment, the first and second blocking materials may include (or be) substantially the same material.

In an example embodiment, the photo mask may further include a third blocking layer disposed on the second blocking layer. The third blocking layer may include a third blocking material.

In an example embodiment, an absorptance of the third blocking layer may be greater than an absorptance of the second blocking layer.

In an example embodiment, the third blocking material may include a black matrix.

In an example embodiment, the third blocking material may include a material of which a reflectance is greater than a reflectance of the second blocking material.

In an example embodiment, the third blocking material may include chrome (Cr) or an alloy thereof.

According to example embodiments, in a method of manufacturing a photo mask, a first blocking material is deposited on a transparent substrate. A first blocking layer is formed by patterning the first blocking material. The first blocking layer includes a plurality of blocking patterns for transmitting a portion of light. A photoguide layer is formed on the first blocking layer. The photoguide layer includes a photoguide material of which a refractive index is greater than a refractive index of the first blocking layer. A second blocking layer is formed on the photoguide layer. The second blocking layer includes a second blocking material of which a refractive index is less than the refractive index of the photoguide layer.

In an example embodiment, a third blocking layer may further be formed on the second blocking layer. The third blocking layer may include a third blocking material.

In an example embodiment, the blocking patterns may have a slit pattern.

In an example embodiment, the blocking patterns may have a scattering pattern.

In an example embodiment, the refractive index of the photoguide layer may be greater than each of the refractive indexes of the first and second blocking layers by about 1%.

In an example embodiment, the refractive index of the photoguide layer may be in a range of about 1.1 to about 2.0. The refractive indexes of the first and second blocking layers may each be in a range of about 1.0 to about 1.4, respectively.

In an example embodiment, the first blocking material may be further coated with a photoresist. A laser may further be radiated on the photoresist utilizing a laser beam to harden a photo pattern corresponding to the blocking patterns. The first blocking material may further be etched by utilizing the photo pattern as a mask to form the blocking patterns.

According to the photo mask and a method of manufacturing the photo mask in accordance with example embodiments of the inventive concept, the light incident on the blocking portion of the mask may be reflected to the transmitting portion of the mask by a total reflection.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
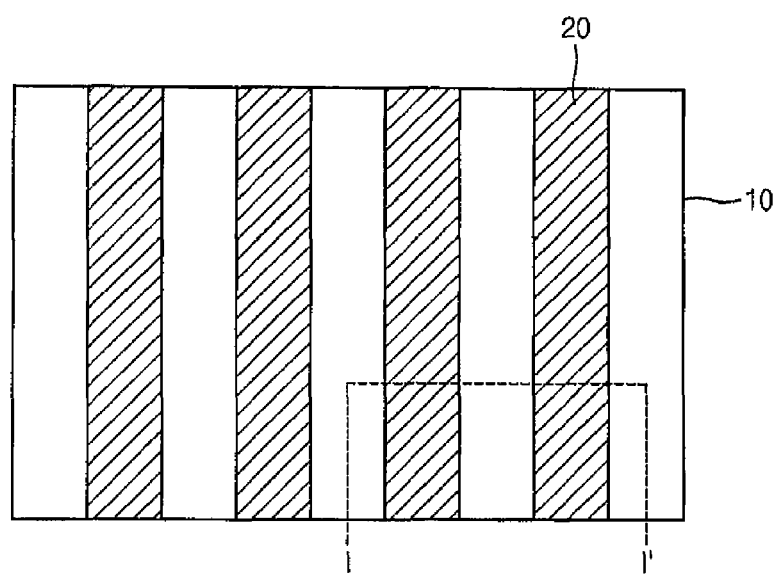
FIG. 1 is a plan view illustrating a photo mask according to example embodiments.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application. Further, the use of "may" when describing embodiments of the present invention refers to "one or more embodiments of the present invention." As used herein, the term "substantially," "about," and similar terms are used as terms of approximation and not as terms of degree, and are intended to account for the inherent deviations in measured or calculated values that would be recognized by those of ordinary skill in the art. Also, as used herein, the terms "use," "using," and "used" may be considered synonymous with the terms "utilize," "utilizing," and "utilized," respectively. Also, any numerical range recited herein is intended to include all sub-ranges of the same numerical precision subsumed within the recited range. For example, a range of "1.1 to 2.0" is intended to include all subranges between (and including) the recited minimum value of 1.1 and the recited maximum value of 2.0, that is, having a minimum value equal to or greater than 1.1 and a maximum value equal to or less than 2.0, such as, for example, 1.4 to 1.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. §112, first paragraph, and 35 U.S.C. §132(a).

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
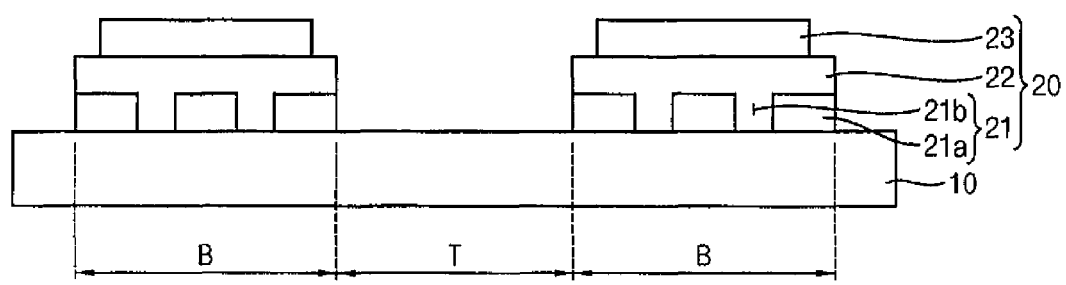
FIG. 2 is a cross-sectional view illustrating the photo mask cut along the line I-I' of FIG. 1.
Figure 3A:
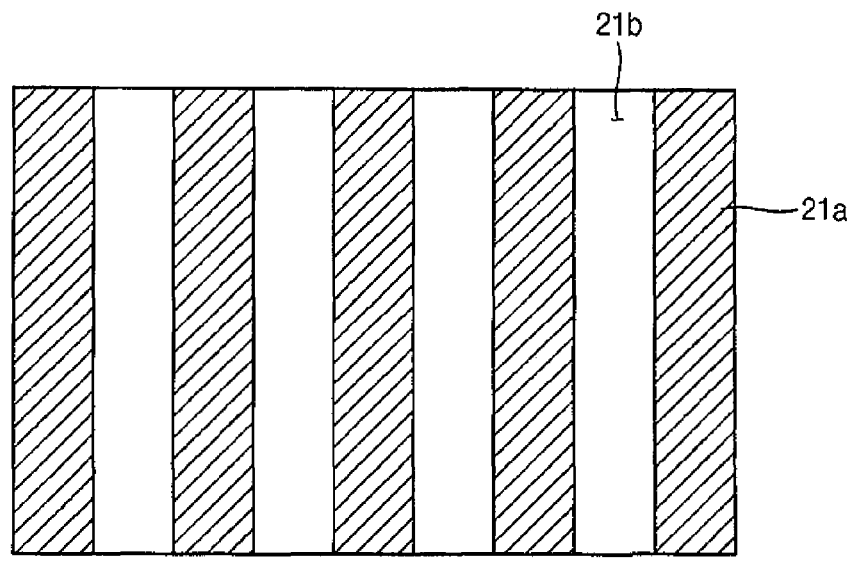
FIGS. 3A and 3B are plan views illustrating a mask pattern of FIG. 1.
Figure 3B:
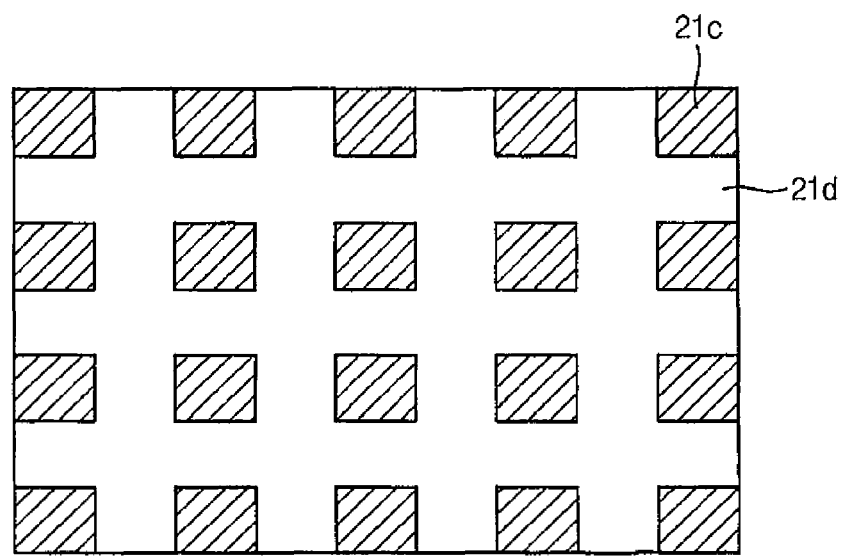

FIG. 1 is a plan view illustrating a photo mask according to example embodiments. FIG. 2 is a cross-sectional view illustrating the photo mask cut along the line I-I' of FIG. 1. FIGS. 3A and 3B are plan views illustrating a mask pattern of FIG. 1.

Referring to FIGS. 1 and 2, the photo mask includes a transparent substrate 10 and a mask pattern 20.

For example, the transparent substrate 10 may be a glass substrate or a transparent plastic substrate.

The mask pattern 20 may be disposed on the transparent substrate 10. The mask pattern 20 may reflect light incident on the mask pattern 20 to a side surface of the mask pattern 20.

For example, the mask pattern 20 may have a line-and-space pattern on the transparent substrate 10. The line-and-space pattern may include a blocking portion B blocking the light and a transmitting portion T transmitting the light. Widths of the blocking portion B and the transmitting portion T may correspond to desired widths of a metal pattern and a photoresist pattern, respectively, and accordingly the widths of the blocking portion B and the transmitting portion T may be adjusted.

The blocking portion B may include a first blocking layer 21, a photoguide layer 22 and a second blocking layer 23.

The first blocking layer 21 may be disposed on the transparent substrate 10 to transmit a portion of the light.

Referring to FIG. 3A, the first blocking layer 21 may include a plurality of blocking patterns 21a and slits 21b between the blocking patterns 21a. For example, the first blocking layer 21 may have a slit pattern. A width of the slit pattern may be adjusted such that the mask pattern has a desired transmittance.

Referring to FIG. 3B, the first blocking layer 21 may include a plurality of blocking patterns 21c and a gap 21d between the blocking patterns 21c. For example, the first blocking layer 21 may have a scattering pattern. A gap of the scattering pattern may be adjusted such that the mask pattern has a desired transmittance.

The blocking patterns 21a may include a first blocking material.

For example, the first blocking material may include at least one material selected from the group consisting of aluminum oxide (AlOx), barium fluoride (BaFx), gadolinium fluoride (GdF), hafnium fluoride (HfFx), hafnium oxide (HfOx), lanthanum fluoride (LaFx), lithium fluoride (LiF), magnesium fluoride (MgFx), magnesium oxide (MgO), silicon nitride (SiNx), silicon oxide (SiOx), strontium fluoride (SrFx), tantalum oxide (TaOx) and yttrium fluoride (YFx).

The photoguide layer 22 may be disposed on the first blocking layer 21 to guide the transmitted portion of the light to a surface of the photoguide layer 22.

For example, the photoguide layer 22 may include a photoguide material of which a refractive index is greater than a refractive index of the first blocking layer 21.

A refractive index of the photoguide layer 22 may be greater than the refractive index of the first blocking layer 21 by about 1%. Accordingly, if the transmitted portion of the light in the photoguide layer 22 is incident on the first blocking layer 21, the transmitted portion of the light may be totally reflected by the first blocking layer 21.

For example, the refractive index of the photoguide layer may be in a range of about 1.1 to about 2.0, and the refractive indexes of the first and second blocking layers may each be in a range of about 1.0 to about 1.4.

Accordingly, the transmitted light may be totally reflected in the photoguide layer 22 and may be guided to the surface of the photoguide layer 22.

For example, the photoguide material may include at least one material selected from the group consisting of aluminum oxide (AlOx), barium fluoride (BaFx), gadolinium fluoride (GdF), hafnium fluoride (HfFx), hafnium oxide (HfOx), lanthanum fluoride (LaFx), lithium fluoride (LiF), magnesium fluoride (MgFx), magnesium oxide (MgO), silicon nitride (SiNx), silicon oxide (SiOx), strontium fluoride (SrFx), tantalum oxide (TaOx) and yttrium fluoride (YFx).

The second blocking layer 23 may be disposed on the photoguide layer 22 to reflect the transmitted light.

For example, the second blocking layer 23 may include a second blocking material of which a refractive index is less than the refractive index of the photoguide layer 22.

The refractive index of the photoguide layer 22 may be greater than a refractive index of the second blocking layer 23 by about 1%. Accordingly, if the transmitted portion of the light in the photoguide layer 22 is incident on the second blocking layer 23, the transmitted portion of the light may be totally reflected by the second blocking layer 23.

For example, the refractive index of the photoguide layer may be in a range of about 1.1 to about 2.0, and the refractive indexes of the first and second blocking layers may each be in a range of about 1.0 to about 1.4.

Accordingly, the transmitted light may be totally reflected in the photoguide layer 22 and may be guided to the surface of the photoguide layer 22.

For example, the second blocking material may include at least one material selected from the group consisting of aluminum oxide (AlOx), barium fluoride (BaFx), gadolinium fluoride (GdF), hafnium fluoride (HfFx), hafnium oxide (HfOx), lanthanum fluoride (LaFx), lithium fluoride (LiF), magnesium fluoride (MgFx), magnesium oxide (MgO), silicon nitride (SiNx), silicon oxide (SiOx), strontium fluoride (SrFx), tantalum oxide (TaOx) and yttrium fluoride (YFx).

In particular, the total reflection may be determined by factors of an incidence angle θ of the light and the refractive indexes n of the photoguide layer 22 guiding the light and the first and second blocking layers 21 and 23 making contact with a top surface and a bottom surface of the photoguide layer 22, respectively. If the light is incident on the first blocking layer 21 or the second blocking layer 23 of which the refractive indexes are less than the refractive index of the photoguide layer 22 with an angle θ of incidence greater than an critical angle θc, the light may be totally reflected by the first and second blocking layers 21 and 23.

The critical angle θc may be represented by an Equation 1 below.

$$\theta_c = \sin^{-1} \frac{(n_1^2 - n_2^2)^{1/2}}{n_1} \qquad \text{Equation 1}$$

In the Equation 1, the $n_1$ is the refractive index of the photoguide layer 22, and the $n_2$ is the refractive index of the first blocking layer 21 or the second blocking layer 23. The $n_2$ may be greater than the $n_1$.

For example, the first and second blocking materials may include the same material. The first and second blocking layers 21 and 23 may include the first and second blocking materials such that the refractive indexes of the first and second blocking layers 21 and 23 are less than the refractive index of the photoguide layer 22.

FIGS. 4A to 4G are cross-sectional views for describing a method of manufacturing the photo mask of FIG. 1 according to example embodiments.

Figure 4A:
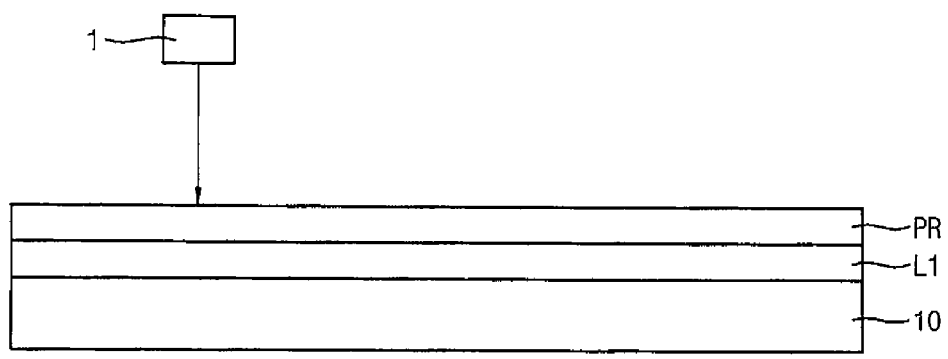
FIGS. 4A to 4G are cross-sectional views for describing a method of manufacturing the photo mask of FIG. 1 according to example embodiments.

Referring to FIG. 4A, a first blocking material is deposited on a transparent substrate 10 to form a first blocking material layer L1.

For example, the first blocking material may include at least one material selected from the group consisting of aluminum oxide (AlOx), barium fluoride (BaFx), gadolinium fluoride (GdF), hafnium fluoride (HfFx), hafnium oxide (HfOx), lanthanum fluoride (LaFx), lithium fluoride (LiF), magnesium fluoride (MgFx), magnesium oxide (MgO), silicon nitride (SiNx), silicon oxide (SiOx), strontium fluoride (SrFx), tantalum oxide (TaOx) and yttrium fluoride (YFx).

The first blocking material layer L1 may be coated with a photoresist material to form a photoresist layer PR. For example, the photoresist material may be a negative-type photoresist (negative resist) material.

The photoresist layer PR may be radiated by a laser using a laser beam 1 provided over the transparent substrate 10. A region radiated by the laser may be hardened.

The region corresponding to blocking patterns by moving the laser beam 1 may be hardened. For example, a cross-sectional diameter of the laser emitted by the laser beam 1 may be in a range of about 0.5 μm to about 1.5 μm.

The region radiated by the laser may be hardened to form a photo pattern PT.

Figure 4B:
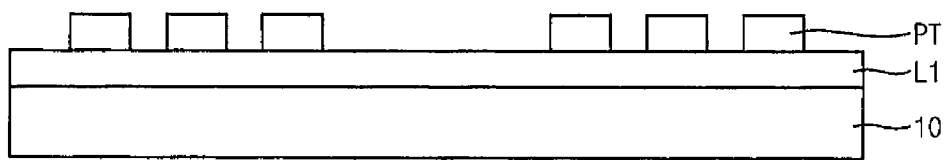

Referring to FIG. 4B, the photo pattern PT is formed by developing the hardened region of the photoresist layer PR using a developer.

Figure 4C:
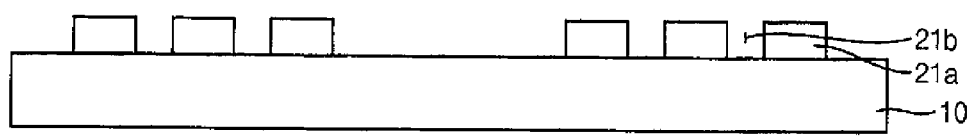

Referring to FIG. 4C, the first blocking material layer L1 is etched by using the photo pattern PT as a mask to pattern a first blocking layer 21 including blocking patterns 21a.

In some example embodiments, as illustrated in FIG. 3A, the first blocking layer 21 may be patterned to include a plurality of blocking patterns 21a and slits 21b between the blocking patterns 21a. For example, the first blocking layer 21 may have a slit pattern. A width of the slit pattern may be adjusted such that the mask pattern has a desired transmittance.

In other example embodiments, as illustrated in FIG. 3B, the first blocking layer 21 may be patterned to include a plurality of blocking patterns 21c and a gap 21d between the blocking patterns 21c. For example, the first blocking layer 21 may have a scattering pattern. A gap of the scattering pattern may be adjusted such that the mask pattern has a desired transmittance.

Figure 4D:
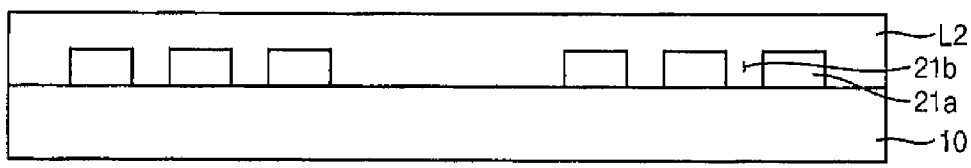

Referring to FIG. 4D, a photoguide material is deposited on the first blocking layer 21 to form a photoguide material layer L2.

For example, the photoguide material may include at least one material selected from the group consisting of aluminum oxide (AlOx), barium fluoride (BaFx), gadolinium fluoride (GdF), hafnium fluoride (HfFx), hafnium oxide (HfOx), lanthanum fluoride (LaFx), lithium fluoride (LiF), magnesium fluoride (MgFx), magnesium oxide (MgO), silicon nitride (SiNx), silicon oxide (SiOx), strontium fluoride (SrFx), tantalum oxide (TaOx) and yttrium fluoride (YFx).

The photoguide material layer L2 may be coated with a photoresist material to form a photoresist layer.

The photoresist layer may be radiated by a laser using a laser beam 1 provided over the transparent substrate 10. A region radiated by the laser may be hardened.

Figure 4E:
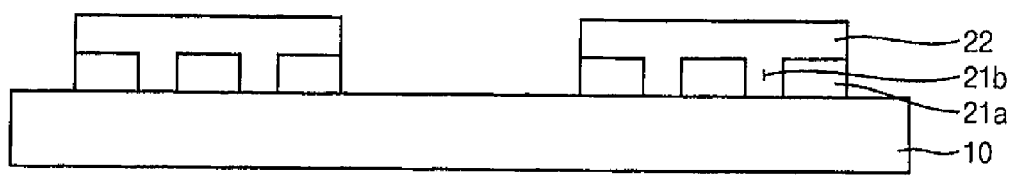

Referring to FIG. 4E, a photoguide layer 22 is formed on the blocking patterns 21a by patterning the photoguide material layer L2. The photoguide layer 22 may be disposed between the blocking patterns 21a.

For example, a refractive index of the photoguide layer 22 may be greater than a refractive index of the first blocking layer 21.

The refractive index of the photoguide layer 22 may be greater than the refractive index of the first blocking layer 21 by about 1%. Accordingly, if a transmitted portion of light in the photoguide layer 22 is incident on the first blocking layer 21, the transmitted portion of the light may be totally reflected by the first blocking layer 21.

Accordingly, the transmitted light may be totally reflected in the photoguide layer 22 and may be guided to the surface of the photoguide layer 22.

Figure 4F:
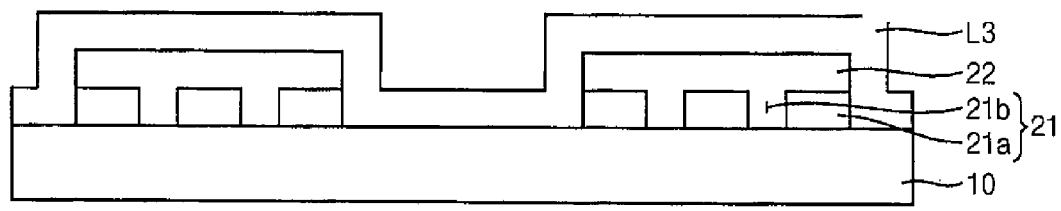

Referring to FIG. 4F, a second blocking material is deposited on the photoguide layer 22 to form a second blocking material layer L3.

For example, the second blocking material may include at least one material selected from the group consisting of aluminum oxide (AlOx), barium fluoride (BaFx), gadolinium fluoride (GdF), hafnium fluoride (HfFx), hafnium oxide (HfOx), lanthanum fluoride (LaFx), lithium fluoride (LiF), magnesium fluoride (MgFx), magnesium oxide (MgO), silicon nitride (SiNx), silicon oxide (SiOx), strontium fluoride (SrFx), tantalum oxide (TaOx) and yttrium fluoride (YFx).

The second blocking material layer L3 may be coated with a photoresist material to form a photoresist layer.

The photoresist layer may be radiated by a laser using a laser beam 1 provided over the transparent substrate 10. A region radiated by the laser may be hardened.

Figure 4G:
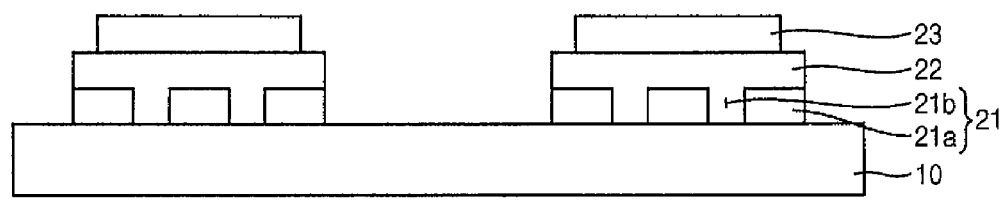

Referring to FIG. 4G, a second blocking layer 23 is formed on the photoguide layer 22 by patterning the second blocking material layer L3.

For example, the refractive index of the photoguide layer 22 may be greater than a refractive index of the second blocking layer 23.

The refractive index of the photoguide layer 22 may be greater than the refractive index of the second blocking layer 23 by about 1%. Accordingly, if a transmitted portion of light in the photoguide layer 22 is incident on the second blocking layer 23, the transmitted portion of the light may be totally reflected by the second blocking layer 23.

Accordingly, the transmitted light may be totally reflected in the photoguide layer 22 and may be guided to the surface of the photoguide layer 22.

Figure 5:
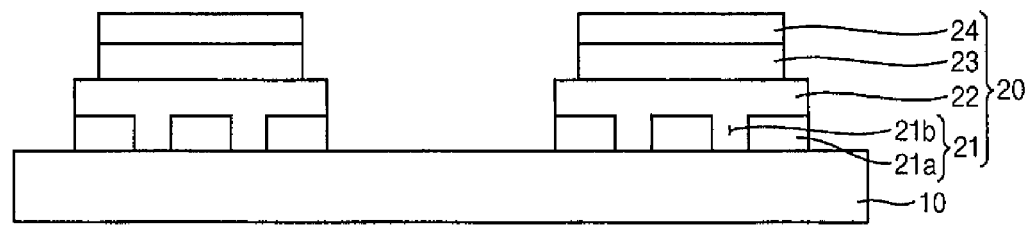
FIG. 5 is a cross-sectional view illustrating a photo mask according to example embodiments.

FIG. 5 is a cross-sectional view illustrating a photo mask according to example embodiments.

The photo mask according to an example embodiment in FIG. 5 may be substantially the same as or similar to the photo mask illustrated in FIG. 2, except for a third blocking layer. Thus, like reference numerals refer to like elements, and detailed descriptions thereon are omitted herein.

Referring to FIG. 5, the photo mask includes a transparent substrate 10 and a mask pattern 20.

For example, the mask pattern 20 may have a line-and-space pattern on the transparent substrate 10. The line-and-space pattern may include a blocking portion B blocking the light and a transmitting portion T transmitting the light.

The blocking portion B may include a first blocking layer 21, a photoguide layer 22, a second blocking layer 23 and a third blocking layer 24.

The first blocking layer 21 may be disposed on the transparent substrate 10 to transmit a portion of the light.

The blocking patterns 21a may include a first blocking material.

The photoguide layer 22 may be disposed on the first blocking layer 21 to guide the transmitted portion of the light to a surface of the photoguide layer 22.

Accordingly, transmitted light may be totally reflected in the photoguide layer 22 and may be guided to the surface of the photoguide layer 22.

The second blocking layer 23 may be disposed on the photoguide layer 22 to reflect the transmitted light.

For example, the second blocking layer 23 may include a second blocking material of which a refractive index is less than the refractive index of the photoguide layer 22.

The refractive index of the photoguide layer 22 may be greater than a refractive index of the second blocking layer 23 by about 1%. Accordingly, if the transmitted portion of the light in the photoguide layer 22 is incident on the second blocking layer 23, the transmitted portion of the light may be totally reflected by the second blocking layer 23.

For example, the refractive index of the photoguide layer may be in a range of about 1.1 to about 2.0, and the refractive indexes of the first and second blocking layers may each be in a range of about 1.0 to about 1.4.

Accordingly, the transmitted light may be totally reflected in the photoguide layer 22 and may be guided to the surface of the photoguide layer 22.

In particular, the total reflection may be determined by factors of an incidence angle θ of the light and the refractive indexes n of the photoguide layer 22 guiding the light and the first and second blocking layers 21 and 23 making contact with a top surface and a bottom surface of the photoguide layer 22, respectively. If the light is incident on the first blocking layer 21 or the second blocking layer 23 of which the refractive indexes are less than the refractive index of the photoguide layer 22 with an angle θ of incidence greater than an critical angle θc, the light may be totally reflected by the first and second blocking layers 21 and 23.

However, if the light is incident on the first blocking layer 21 or the second blocking layer 23 with an angle θ of incidence less than a critical angle θc, the light may be transmitted through the second blocking layer 23. Accordingly, the blocking portion B which blocks the light to form a photo pattern may not block the light completely such that the desired photo pattern is not formed.

The third blocking layer 24 may be formed to include a third blocking material on the second blocking layer 23. The third blocking layer 24 may block the light transmitted through the second blocking layer 23.

An absorptance of the third blocking material may be greater than an absorptance of the second blocking material. For example, the third blocking material may include a black matrix.

A reflectance of the third blocking material may be greater than a reflectance of the second blocking material. For example, the third blocking material may include chrome (Cr) or an alloy thereof.

FIGS. 6A to 6D are cross-sectional views for describing a method of manufacturing a display panel.

Figure 6A:
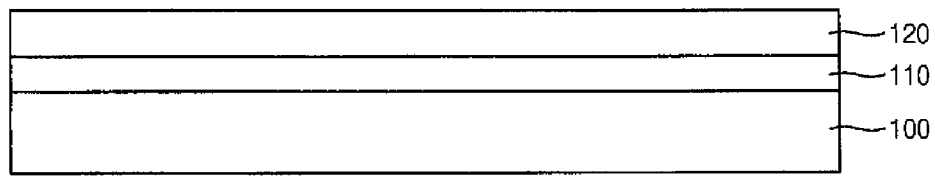
FIGS. 6A to 6D are cross-sectional views for describing a method of manufacturing a display panel.

Referring to FIG. 6A, a metal layer 110 is formed on a base substrate 100.

For example, the base substrate 100 may be a glass substrate or a transparent plastic substrate.

The metal layer 110 may include copper (Cu) or an alloy thereof.

For example, the metal layer 110 may be formed to form a gate pattern including a gate electrode GE and a gate line GL.

For example, the metal layer 110 may be formed to form a data pattern including a source electrode SE, a drain electrode DE and a data line DL.

The metal layer 110 may be coated with a photoresist material to form a photoresist layer 120.

For example, the photoresist material may be a positive-type photoresist (positive resist) material.

Figure 6B:
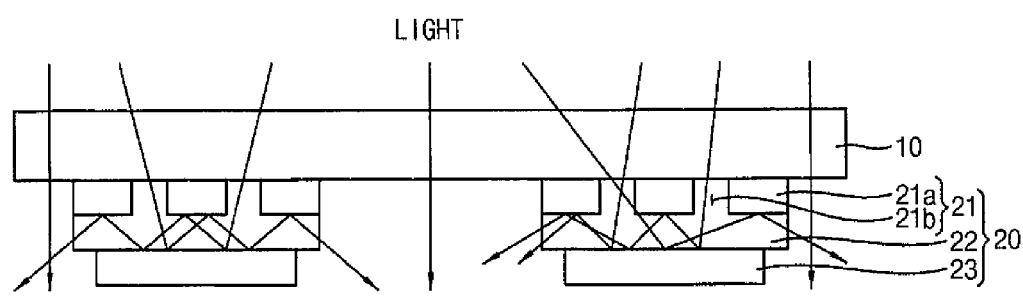
Figure 6B:
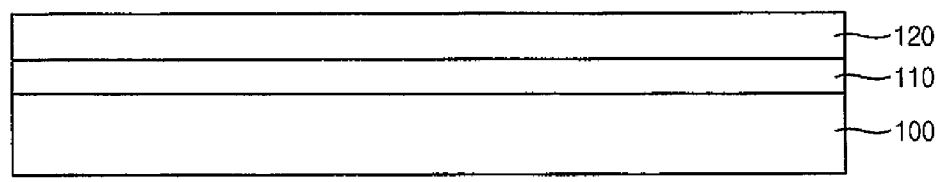

Referring to FIG. 6B, a photo mask including a transparent substrate 10 and a mask pattern 20 is disposed over the photoresist layer 120 to expose the photoresist layer 120.

For example, the mask pattern 20 may have a line-and-space pattern on the transparent substrate 10. The line-and-space pattern may include a blocking portion blocking the light and a transmitting portion transmitting the light. Widths of the blocking portion and the transmitting portion may correspond to desired widths of a metal pattern and a photoresist pattern, respectively, and accordingly the widths of the blocking portion and the transmitting portion may be adjusted.

The blocking portion may include a first blocking layer 21, a photoguide layer 22 and a second blocking layer 23.

For example, the first blocking layer 21 may include a first blocking material of which a refractive index is less than a refractive index of the photoguide layer 22. For example, the second blocking layer 23 may include a second blocking material of which a refractive index is less than the refractive index of the photoguide layer 22.

The refractive index of the photoguide layer 22 may be greater than a refractive index of the second blocking layer 23 by about 1%. Accordingly, if the transmitted portion of the light in the photoguide layer 22 is incident on the second blocking layer 23, the transmitted portion of the light may be totally reflected by the second blocking layer 23.

Accordingly, the transmitted light may be totally reflected in the photoguide layer 22 and may be guided to the surface of the photoguide layer 22.

A portion of light incident on the blocking portion may be guided to the surface of the photoguide layer 22, and the photoresist layer 120 may be exposed by light transmitted through the transmitting portion and the light guided by the blocking portion together.

According to example embodiments, exposure to the photoresist layer 120 corresponding to the transmitting portion may be increased.

Figure 6C:
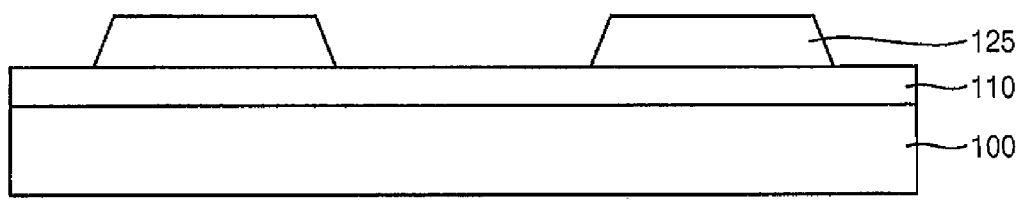
Figure 6D:
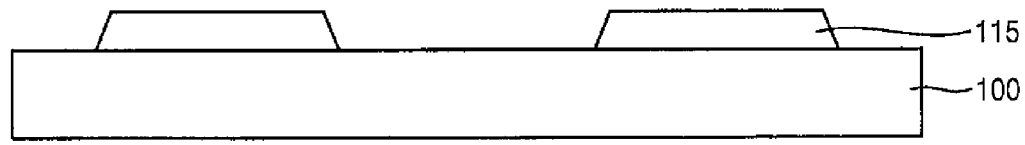

Referring to FIGS. 6C and 6D, the photoresist layer 120 is developed to form a photo pattern 125.

The metal layer 110 may be etched by using the photo pattern 125 as a mask to form a metal pattern 115.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and equivalents thereof.

What is claimed is:

1. A photo mask comprising:
   a transparent substrate; and
   a mask pattern on the transparent substrate, the mask pattern comprising a blocking portion for blocking light and a transmitting portion for transmitting the light, the transmitting portion being adjacent to the blocking portion, and
   the blocking portion comprising:
   a first blocking layer on the transparent substrate, the first blocking layer for transmitting a portion of the light, and the first blocking layer comprising a plurality of blocking patterns comprising a first blocking material;
   a photoguide layer on the first blocking layer, the photoguide layer for guiding the transmitted portion of the light to a side surface of the photoguide layer, and the photoguide layer comprising a photoguide material of which a refractive index is greater than a refractive index of the first blocking layer; and
   a second blocking layer on the photoguide layer, the second blocking layer for reflecting the transmitted portion of the light, and the second blocking layer comprising a second blocking material of which a refractive index is less than the refractive index of the photoguide material.

2. The photo mask of claim 1, wherein the blocking patterns have a slit pattern.

3. The photo mask of claim 1, wherein the blocking patterns have a scattering pattern.

4. The photo mask of claim 1, wherein the refractive index of the photoguide layer is greater than each of the refractive indexes of the first and second blocking layers by about 1%.

5. The photo mask of claim 4, wherein the refractive index of the photoguide layer is in a range of about 1.1 to about 2.0, and wherein the refractive indexes of the first and second blocking layers are each in a range of about 1.0 to about 1.4, respectively.

6. The photo mask of claim 1, wherein the first and second blocking materials comprise at least one material selected from the group consisting of aluminum oxide (AlOx), barium fluoride (BaFx), gadolinium fluoride (GdF), hafnium fluoride (HfFx), hafnium oxide (HfOx), lanthanum fluoride (LaFx), lithium fluoride (LiF), magnesium fluoride (MgFx), magnesium oxide (MgO), silicon nitride (SiNx), silicon oxide (SiOx), strontium fluoride (SrFx), tantalum oxide (TaOx) and yttrium fluoride (YFx).

7. The photo mask of claim 1, wherein the photoguide material comprises at least one material selected from the group consisting of aluminum oxide (AlOx), barium fluoride (BaFx), gadolinium fluoride (GdF), hafnium fluoride (HfFx), hafnium oxide (HfOx), lanthanum fluoride (LaFx), lithium fluoride (LiF), magnesium fluoride (MgFx), magnesium oxide (MgO), silicon nitride (SiNx), silicon oxide (SiOx), strontium fluoride (SrFx), tantalum oxide (TaOx) and yttrium fluoride (YFx).

8. The photo mask of claim 1, wherein the first and second blocking materials comprise substantially the same material.

9. The photo mask of claim 1, further comprising:
   a third blocking layer on the second blocking layer, the third blocking layer comprising a third blocking material.

10. The photo mask of claim 9, wherein an absorptance of the third blocking layer is greater than an absorptance of the second blocking layer.

11. The photo mask of claim 10, wherein the third blocking material comprises a black matrix.

12. The photo mask of claim 9, wherein the third blocking material comprises a material of which a reflectance is greater than a reflectance of the second blocking material.

13. The photo mask of claim 12, wherein the third blocking material comprises chrome (Cr) or an alloy thereof.

14. A method of manufacturing a photo mask, the method comprising:
   depositing a first blocking material on a transparent substrate;
   forming a first blocking layer by patterning the first blocking material, the first blocking layer comprising a plurality of blocking patterns for transmitting a portion of light;
   forming a photoguide layer on the first blocking layer, the photoguide layer comprising a photoguide material of which a refractive index is greater than a refractive index of the first blocking layer; and
   forming a second blocking layer on the photoguide layer, the second blocking layer comprising a second blocking material of which a refractive index is less than the refractive index of the photoguide layer.

15. The method of claim 14, further comprising:
   forming a third blocking layer on the second blocking layer, the third blocking layer comprising a third blocking material.

16. The method of claim 14, wherein the blocking patterns have a slit pattern.

17. The method of claim 14, wherein the blocking patterns have a scattering pattern.

18. The method of claim 14, wherein the refractive index of the photoguide layer is greater than each of the refractive indexes of the first and second blocking layers by 1%.

19. The method of claim 18, wherein the refractive index of the photoguide layer is in a range of about 1.1 to about 2.0, and wherein the refractive indexes of the first and second blocking layers are each in a range of about 1.0 to about 1.4, respectively.

20. The method of claim 14, further comprising:
   coating the first blocking material with a photoresist;
   radiating a laser on the photoresist utilizing a laser beam to harden a photo pattern corresponding to the blocking patterns; and
   etching the first blocking material utilizing the photo pattern as a mask to form the blocking patterns.

* * * * *